(12) United States Patent
Bull

(10) Patent No.: US 11,782,322 B2
(45) Date of Patent: Oct. 10, 2023

(54) ANISOTROPICALLY CONDUCTIVE MOISTURE BARRIER FILMS AND ELECTRO-OPTIC ASSEMBLIES CONTAINING THE SAME

(71) Applicant: E INK CORPORATION, Billerica, MA (US)

(72) Inventor: Darwin Scott Bull, Harvard, MA (US)

(73) Assignee: E Ink Corporation, Billerica, MA (US)

(*) Notice: Subject to any disclaimer, the term of this patent is extended or adjusted under 35 U.S.C. 154(b) by 0 days.

(21) Appl. No.: 17/978,282

(22) Filed: Nov. 1, 2022

(65) Prior Publication Data

US 2023/0046003 A1 Feb. 16, 2023

Related U.S. Application Data

(63) Continuation of application No. 16/716,618, filed on Dec. 17, 2019, now Pat. No. 11,520,211.
(Continued)

(51) Int. Cl.
*G02F 1/16757* (2019.01)
*G02F 1/167* (2019.01)
*C09D 5/24* (2006.01)

(52) U.S. Cl.
CPC .......... *G02F 1/16757* (2019.01); *C09D 5/24* (2013.01); *G02F 1/167* (2013.01)

(58) Field of Classification Search
CPC .............. G02F 1/133305; G02F 1/167; G02F 1/13306; G02F 1/136; G02F 1/1675; G02F 1/133368; G02F 1/1335; G02F 1/13363; G02F 1/133632; G02F 1/133638; G02F 1/16757; G02F 1/155; G02F 1/0147; G02F 1/061; G02F 1/065; G02F 1/133528; G02F 1/133634; G02F 1/3611; G02F 1/3617; G02F 1/1368; G02F 1/161; G02F 1/163; G02F 2201/501; G02F 2202/40; G02F 1/1303; G02F 1/133502; G02F 1/1343; G02F 1/13613; G02F 1/1362; G02F 1/136231; G02F 1/1506; G02F 1/1508; G02F 1/15165; G02F 1/1533; G02F 1/1676; G02F 2202/022; G02F 2202/28;
(Continued)

(56) References Cited

U.S. PATENT DOCUMENTS 4,170,677 A 10/1979 Hutcheson
4,729,809 A 3/1988 Dery et al.
(Continued)

FOREIGN PATENT DOCUMENTS

JP 2005326662 A 5/2004
WO 2018231201 A1 12/2018

OTHER PUBLICATIONS

Wood, D., "An Electrochromic Renaissance?" Information Display, 18(3), 24 (Mar. 2002) Mar. 1, 2002.
(Continued)

*Primary Examiner* — Brandi N Thomas
(74) *Attorney, Agent, or Firm* — Brian D. Bean

(57) ABSTRACT

An electro-optic assembly includes a layer of electro-optic material configured to switch optical states upon application of an electric field and an anisotropically conductive layer having one or more moisture-resistive polymers and a conductive material, the moisture-resistive polymer having a WVTR less than 5 g/(m$^2$*d).

14 Claims, 3 Drawing Sheets

Related U.S. Application Data

(60) Provisional application No. 62/780,401, filed on Dec. 17, 2018.

(58) Field of Classification Search
CPC ........... G02F 2413/105; G02F 2413/13; G02F 1/172; G02F 2202/16; G02F 1/1333; G02F 1/133531; G02F 1/133633; G02F 1/133637; G02F 1/133711; G02F 1/133723; G02F 1/13454; G02F 1/13471; G02F 1/136277; G02F 2202/104; G02F 2202/105; G02F 2413/04; G02F 2413/08; G02F 2413/12; G02F 1/1334; G02F 1/133541; G02F 1/1337; G02F 1/133715; G02F 1/133784; G02F 1/134309; G02F 1/134372; G02F 1/13336; G02F 1/133512; G02F 1/133514; G02F 1/133553; G02F 1/133567; G02F 1/1339; G02F 1/13394; G02F 1/13398; G02F 1/141; G02F 1/1503; G02F 1/153; G02F 1/1677; G02F 1/1679; G02F 1/1681; G02F 2202/025; H01L 29/7869; H01L 29/66969; H01L 21/6835; H01L 2221/6835; H01L 2224/275; H01L 2224/27515; H01L 2224/2752; H01L 2224/32225; H01L 2224/83192; H01L 2224/83851; H01L 2224/8388; H01L 24/00; H01L 24/27; H01L 24/32; H01L 2924/19041; H01L 2924/30105; H01L 2924/3025; H01L 29/78606; H01L 2924/00012; H01L 27/1214; H01L 2924/0002; G02B 5/3016; G02B 6/1221; G02B 5/3083; G02B 5/3033; G02B 5/30; G02B 1/111; G02B 26/026; G02B 5/305; G02B 27/0172; G02B 5/3041; H10K 2102/3026; H10K 50/844; H10K 71/00; H10K 71/12; H10K 85/113; H10K 85/114; H10K 85/115; H10K 85/151; H10K 85/30; H10K 85/324; H10K 85/342; H10K 85/346; H10K 85/615; H10K 85/649; H10K 50/182; H10K 50/805; H10K 50/822; H10K 50/828; H10K 50/84; H10K 50/8426; H10K 50/846; H10K 59/00; H10K 59/12; H10K 59/122

See application file for complete search history.

(56) References Cited

U.S. PATENT DOCUMENTS

| | | | |
|---|---|---|---|
| 4,857,409 A | 8/1989 | Hazelton et al. | |
| 5,153,039 A | 10/1992 | Porter et al. | |
| 5,760,761 A | 6/1998 | Sheridon | |
| 5,777,782 A | 7/1998 | Sheridon | |
| 5,808,783 A | 9/1998 | Crowley | |
| 6,054,071 A | 4/2000 | Mikkelsen, Jr. | |
| 6,055,091 A | 4/2000 | Sheridon | |
| 6,097,531 A | 8/2000 | Sheridon | |
| 6,128,124 A | 10/2000 | Silverman | |
| 6,137,467 A | 10/2000 | Sheridon | |
| 6,147,791 A | 11/2000 | Sheridon | |
| 6,241,921 B1 | 6/2001 | Jacobson et al. | |
| 6,242,058 B1 | 6/2001 | Bahadur et al. | |
| 6,301,038 B1 | 10/2001 | Fitzmaurice et al. | |
| 6,866,760 B2 | 3/2005 | Paolini, Jr. et al. | |
| 6,870,657 B1 | 3/2005 | Fitzmaurice et al. | |
| 6,922,276 B2 | 7/2005 | Zhang et al. | |
| 6,950,220 B2 | 9/2005 | Abramson et al. | |
| 6,963,435 B2 | 11/2005 | Mallya et al. | |
| 6,982,178 B2 | 1/2006 | LeCain et al. | |
| 7,002,728 B2 | 2/2006 | Pullen et al. | |
| 7,012,364 B2 | 3/2006 | Mori et al. | |
| 7,012,600 B2 | 3/2006 | Zehner et al. | |
| 7,033,655 B2 | 4/2006 | Beteille et al. | |
| 7,072,095 B2 | 7/2006 | Liang et al. | |
| 7,075,502 B1 | 7/2006 | Drzaic et al. | |
| 7,116,318 B2 | 10/2006 | Amundson et al. | |
| 7,144,942 B2 | 12/2006 | Zang et al. | |
| 7,170,670 B2 | 1/2007 | Webber | |
| 7,236,291 B2 | 6/2007 | Kaga et al. | |
| 7,312,784 B2 | 12/2007 | Baucom et al. | |
| 7,321,459 B2 | 1/2008 | Masuda et al. | |
| 7,339,715 B2 | 3/2008 | Webber et al. | |
| 7,411,719 B2 | 8/2008 | Paolini, Jr. et al. | |
| 7,420,549 B2 | 9/2008 | Jacobson et al. | |
| 7,453,445 B2 | 11/2008 | Amundson | |
| 7,535,624 B2 | 5/2009 | Amundson et al. | |
| 7,561,324 B2 | 7/2009 | Duthaler et al. | |
| 7,679,814 B2 | 3/2010 | Paolini, Jr. et al. | |
| 7,715,088 B2 | 5/2010 | Liang et al. | |
| 7,839,564 B2 | 11/2010 | Whitesides et al. | |
| 7,843,626 B2 | 11/2010 | Amundson et al. | |
| 8,009,348 B2 | 8/2011 | Zehner et al. | |
| 8,830,553 B2 | 9/2014 | Patry et al. | |
| 9,279,906 B2 | 3/2016 | Kang | |
| 9,437,347 B2 | 9/2016 | Svasand et al. | |
| 10,174,232 B2 | 1/2019 | Bzowej et al. | |
| 10,310,353 B2 | 6/2019 | Chun et al. | |
| 10,317,762 B2 | 6/2019 | Yamazaki | |
| 10,444,553 B2 | 10/2019 | Laxton | |
| 10,613,407 B2 | 4/2020 | Lin et al. | |
| 2006/0153997 A1 | 7/2006 | Rankin et al. | |
| 2013/0120227 A1 | 5/2013 | Tanikawa | |
| 2015/0005720 A1 | 1/2015 | Zang et al. | |
| 2016/0012710 A1 | 1/2016 | Lu et al. | |
| 2016/0120077 A1 | 4/2016 | Watanabe | |
| 2023/0036810 A1* | 2/2023 | Mohanraj | E04B 1/6807 |

OTHER PUBLICATIONS

O'Regan, B. et al., "A Low Cost, High-efficiency Solar Cell Based on Dye-sensitized colloidal TiO2 Films", Nature, vol. 353, pp. 737-740 (Oct. 24, 1991). Oct. 24, 1991.

Bach, Udo. et al., "Nanomaterials-Based Electrochromics for Paper-Quality Displays", Adv. Mater, vol. 14, No. 11, pp. 845-848, (Jun. 5, 2002). Jun. 5, 2002.

Hayes, R.A. et al., "Video-Speed Electronic Paper Based on Electrowetting", Nature, vol. 425, No. 25, pp. 383-385 (Sep. 2003). Sep. 25, 2003.

Kitamura, T. et al., "Electrical toner movement for electronic paper-like display", Asia Display/IDW '01, pp. 1517-1520, Paper HCS1-1 (2001). 2001.

Yamaguchi, Y. et al., "Toner display using insulative particles charged triboelectrically", Asia Display/IDW '01, pp. 1729-1730, Paper AMD4-4 (2001). 2001.

Korean Intellectual Property Office, PCT/US2019/066733, International Search Report and Written Opinion, dated Apr. 24, 2020. Apr. 24, 2020.

European Patent Office, "Extended European Search Report", EP Appl. No 19900399.7, dated Aug. 9, 2022. Aug. 9, 2022.

\* cited by examiner

ANISOTROPICALLY CONDUCTIVE MOISTURE BARRIER FILMS AND ELECTRO-OPTIC ASSEMBLIES CONTAINING THE SAME

REFERENCE TO RELATED APPLICATIONS

This application is a continuation of U.S. patent application Ser. No. 16/716,618, filed Dec. 17, 2019, which claims priority to U.S. Provisional Application No. 62/780,401 filed on Dec. 17, 2018. All patents and publications disclosed herein are incorporated by reference.

BACKGROUND OF INVENTION

This invention relates to anisotropically conductive films that may be incorporated in electro-optic assemblies. More specifically, in one aspect this invention relates to anisotropically conductive films that have improved moisture barrier properties that may be incorporated into electro-optic devices or displays.

The term "electro-optic", as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

Anisotropically-conductive adhesives have been used in the assembly of microelectronics for many years. As exemplified in U.S. Pat. No. 4,729,809, a typical approach involves loading a thermally-curable epoxy resin with electrically-conductive particles at slightly below the percolation threshold of conductivity. This formulation is then applied between a semiconductor chip and a circuit board with corresponding electrical contacts. Under heat and pressure, the conductive particles are trapped between the contacts of the chip and board to complete the connection without causing shorting due to lateral conductivity.

In addition to the sub-percolation threshold approach, various approaches to orient the conductive particles with either an electric or magnetic field have been used to form anisotropically-conductive films and adhesives. These include use of conductive fibers (U.S. Pat. No. 4,170,677), magnetic particles such as iron oxide (U.S. Pat. No. 7,843,626), and carbon black oriented in an electric field (U.S. Pat. No. 9,437,347)

Another approach at providing anisotropically conductive films is disclosed in U.S. Patent Application No. 2017/0052421, which incorporates the conductive film in a direct-write system utilizing positive and negative corona sources to write or erase, respectively, black and white electrophoretic film. This produces a display that can be addressed in a non-contact manner without the need for any driving electronics on the display device. A thick, anisotropically-conductive layer is provided as a protective layer over the electrophoretic material containing microcapsules in order to prevent mechanical damage to the microcapsules. Anisotropic conductivity is required to allow the ions from the coronas to pass through the protective layer to the layer of electrophoretic material. This conductivity is accomplished by adding electrically-conductive, magnetic particles to a UV curable resin formulation. The loading of the particles is chosen so that exposure to a strong magnetic field aligns the particles in a perpendicular orientation to the plane of the protective layer so that electrical conductivity is achieved in the Z-direction, without any significant lateral conductivity in the X- or Y-directions. Once aligned, the matrix resin is cured with UV radiation to both harden the protective layer and lock in the particle orientation.

One of the main disadvantages of the anisotropically conductive layer disclosed in U.S. Patent Application No. 2017/0052421 is the poor imaging quality at high ambient humidity. Thus, there is a need for anisotropically conductive films with improved moisture barrier properties to preserve the image quality of the display.

SUMMARY OF THE INVENTION

According to one aspect, an electro-optic assembly comprises a layer of electro-optic material configured to switch optical states upon application of an electric field and an anisotropically conductive layer comprising one or more moisture-resistive polymers and a conductive material, the moisture-resistive polymer having a WVTR less than 5 $g/(m^2 \cdot d)$.

These and other aspects of the various embodiments of the present invention will be apparent in view of the following description.

BRIEF DESCRIPTION OF THE FIGURES

The drawing Figures depict implementations in accord with the present concepts, by way of example only, not by way of limitation. In the Figures, like reference numerals refer to the same or similar elements.

DETAILED DESCRIPTION

Generally, the various embodiments of the present invention provide an anisotropically conductive layer and method of forming the same that has inherent moisture vapor barrier properties. This is accomplished by including a moisture resistive polymer in the continuous phase of the anisotropically conductive layer that is cured or cooled during manufacture of the layer. This eliminates the need for an additional barrier-forming step and may provide a barrier with improved mechanical integrity. In addition, certain embodiments of the present invention may preclude the need for specialized radiation curing equipment and eliminate the hazards of handling radiation-curable monomers.

Figure 1:
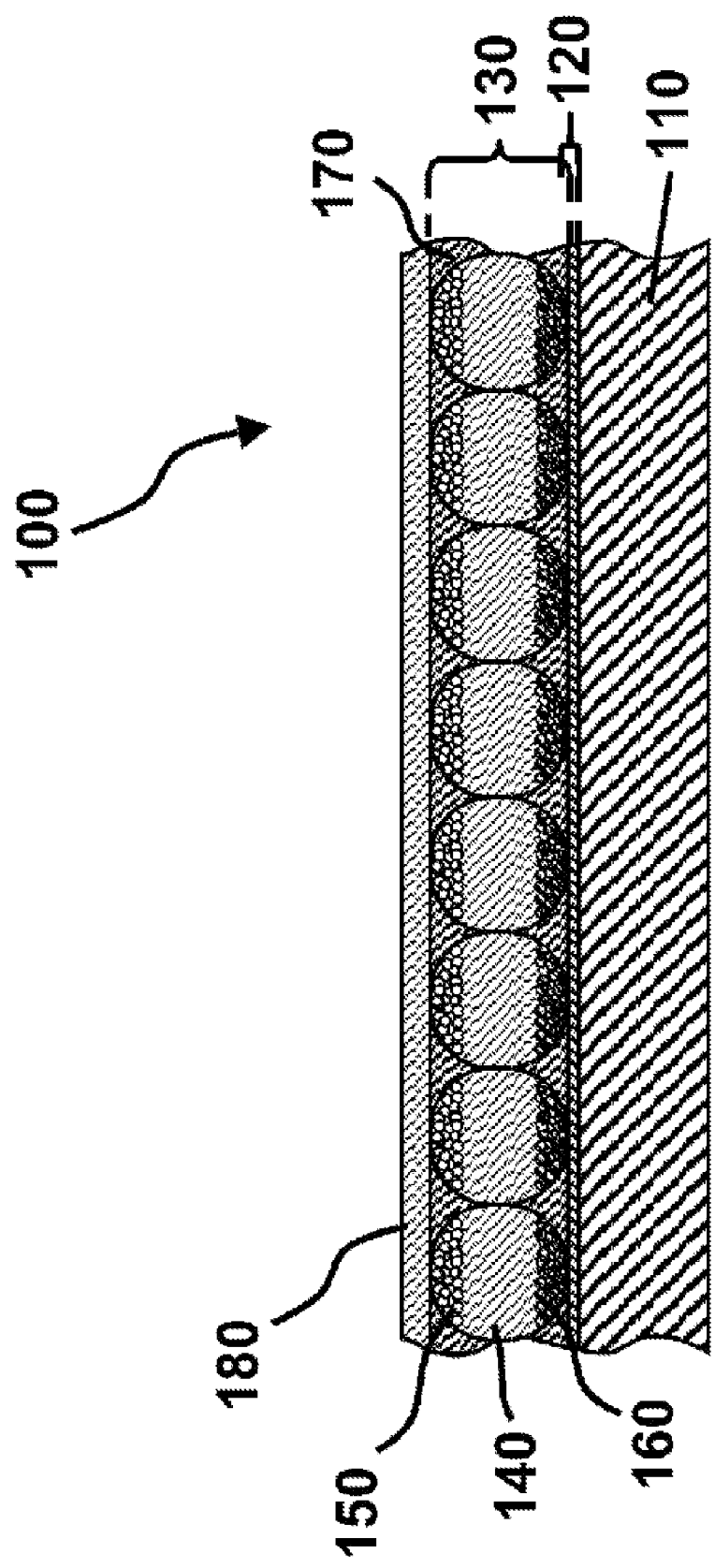
FIG. 1 is a schematic cross-sectional side view of one embodiment according to the present invention.
Figure 2:
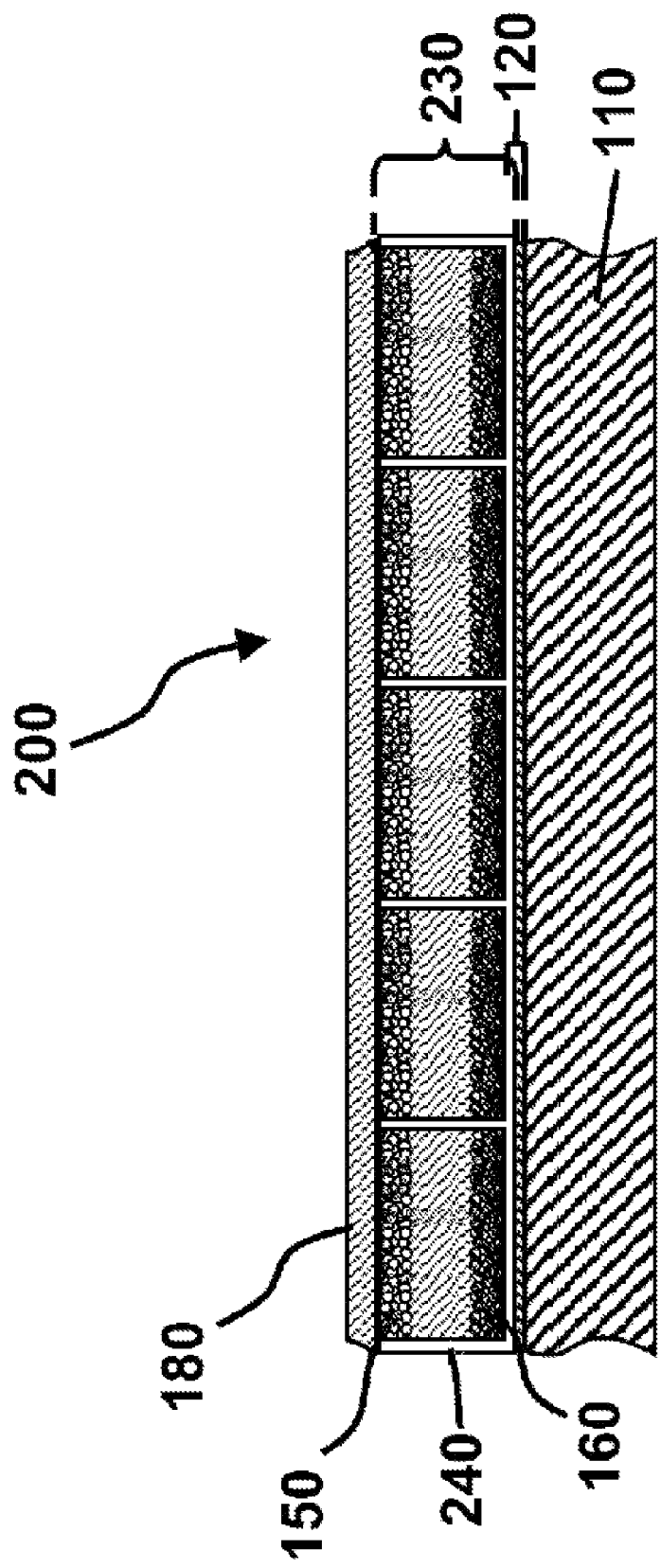
FIG. 2 is a schematic cross-sectional side view of another embodiment according to the present invention.

A schematic of a preferred assembly is illustrated in FIGS. 1 and 2, and a process for making the assembly according to various embodiments of the present invention is provided below. The assembly comprises a substrate, a conductive layer, an electro-optic layer and an anisotropic conductive layer. The assembly may then be incorporated into an electro-optic device, such as a display. An electro-optic display normally comprises a layer of electro-optic material and at least two other layers disposed on opposed sides of the electro-optic material, one of these two layers being an electrode layer. In most such displays both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electro-optic display, which is intended for use with a stylus, print head or similar movable electrode separate from the display (such as the device disclosed in the aforementioned U.S. Patent Application No. 2017/0052421), only one of the layers adjacent the electro-optic layer comprises an electrode, the layer on the opposed side of the electro-optic layer typically being a protective layer intended to prevent the movable electrode damaging the electro-optic layer.

Embodiments of the assembly according to one embodiment of the present invention will now be described, though by way of illustration only, with reference to FIGS. 1 and 2, which is a schematic section through the assembly The assembly (generally designated 100) shown in FIG. 1 comprises a substrate 110, an electrode layer 120, an electro-optic layer 130, and an anisotropically conductive layer 180.

In some embodiments, the substrate 110 and electrode layer 120 may be light transmissive, if the assembly 100 is to be incorporated into a display in which the substrate 110 is intended as the viewing side of the display. In other embodiments, the anisotropically conductive layer 180 may be light transmissive, if it is intended to serve as the viewing surface of a display. In yet another embodiment, all three of the layers, substrate 110, electrode layer 120, and anisotropically conductive layer 180 may be light transmissive, if the assembly 100 is to be incorporated into a dual sided display. The term "light-transmissive" is used herein throughout the specification and the claims to mean that the layer thus designated transmits sufficient light to enable an observer, looking through that layer, to observe the change in display states of the electro-optic medium, which will normally be viewed through the electrically-conductive conductive layer and adjacent substrate; in cases where the electro-optic medium displays a change in reflectivity at non-visible wavelengths, the term "light-transmissive" should of course be interpreted to refer to transmission of the relevant non-visible wavelengths.

The substrate 110 is preferably flexible, in the sense that the substrate can be manually wrapped around a drum (say) 10 inches (254 mm) in diameter without permanent deformation. The substrate will typically be a polymeric film, and will normally have a thickness in the range of about 1 to about 25 mil (25 to 634 µm), preferably about 2 to about 10 mil (51 to 254 µm). The lower surface (in FIG. 1) of substrate 110, which may form the viewing surface of the final display, may have one or more additional layers (not shown), for example a protective layer to absorb ultra-violet radiation, barrier layers to prevent ingress of oxygen or moisture into the final display, and anti-reflection coatings to improve the optical properties of the display. If it is not necessary for the substrate 110 to be light transmissive, any compatible flexible materials known to those of skill in the art may be used.

Coated on to the upper surface of substrate 110 is an electrically conductive electrode layer 120, which may serve as the common electrode in the final display device. As previously mentioned, the electrode layer 120 may be provided in the form of a thin light-transmissive layer of metal or metal oxide, such as aluminum or ITO for example, or may be a conductive polymer. Poly(ethylene terephthalate) (PET) films coated with aluminum or ITO are available commercially, for example as "aluminized Mylar" ("Mylar" is a Registered Trade Mark) from E.I. du Pont de Nemours & Company, Wilmington Del., and such commercial materials may be used with good results as the substrate 110 and electrode 120 layers in the various embodiments of the present invention.

A layer of electro-optic material 130 may then be applied over the opposing surface of the electrode layer 120 relative to the substrate 110. Various types of electro-optic materials may be incorporated in the various embodiments of the present invention, such as solid electro-optic materials.

Some electro-optic materials are solid in the sense that the materials have solid external surfaces, although the materials may, and often do, have internal liquid- or gas-filled spaces. Displays using solid electro-optic materials may hereinafter for convenience be referred to as "solid electro-optic displays". Thus, the term "solid electro-optic displays" includes rotating bichromal member displays, encapsulated electrophoretic displays, microcell electrophoretic displays and encapsulated liquid crystal displays.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in U.S. Pat. No. 7,170,670 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

A display containing rotating bichromal member type material is described, for example, in U.S. Pat. Nos. 5,808,783; 5,777,782; 5,760,761; 6,054,071 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed by applying an electric field thereto, thus rotating the bodies to various positions and varying which of the sections of the bodies is seen through a viewing surface. This type of electro-optic medium is typically bistable.

Another type of electro-optic display may use an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. Nos. 6,301,038; 6,870,657; and 6,950,220. This type of medium is also typically bistable.

Another type of electro-optic display is an electro-wetting display developed by Philips and described in Hayes, R. A., et al., "Video-Speed Electronic Paper Based on Electrowetting", Nature, 425, 383-385 (2003). It is shown in U.S. Pat. No. 7,420,549 that such electro-wetting displays can be made bistable.

A preferred type of electro-optic material that may be incorporated in the various embodiments of the present invention is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays.

Electrophoretic media require the presence of a fluid. In most prior art electrophoretic media, this fluid is a liquid, but electrophoretic media can be produced using gaseous fluids; see, for example, Kitamura, T., et al., "Electrical toner movement for electronic paper-like display", IDW Japan, 2001, Paper HCS1-1, and Yamaguchi, Y., et al., "Toner display using insulative particles charged triboelectrically", IDW Japan, 2001, Paper AMD4-4). See also U.S. Pat. Nos. 7,321,459 and 7,236,291.

Numerous patents and applications assigned to or in the names of the Massachusetts Institute of Technology (MIT), E Ink Corporation, E Ink California, LLC and related companies describe various technologies used in encapsulated and microcell electrophoretic and other electro-optic media. Encapsulated electrophoretic media comprise numerous small capsules, each of which itself comprises an internal phase containing electrophoretically-mobile particles in a fluid medium, and a capsule wall surrounding the internal phase. Typically, the capsules are themselves held within a polymeric binder to form a coherent layer positioned between two electrodes. In a microcell electrophoretic display, the charged particles and the fluid are not encapsulated within microcapsules but instead are retained within a plurality of cavities formed within a carrier medium, typically a polymeric film. The technologies described in these patents and applications include:

(a) Electrophoretic particles, fluids and fluid additives; see for example U.S. Pat. Nos. 7,002,728 and 7,679,814;

(b) Capsules, binders and encapsulation processes; see for example U.S. Pat. Nos. 6,922,276 and 7,411,719;

(c) Microcell structures, wall materials, and methods of forming microcells; see for example U.S. Pat. Nos. 7,072,095 and 9,279,906;

(d) Methods for filling and sealing microcells; see for example U.S. Pat. Nos. 7,144,942 and 7,715,088;

(e) Films and sub-assemblies containing electro-optic materials; see for example U.S. Pat. Nos. 6,982,178 and 7,839,564;

(f) Backplanes, adhesive layers and other auxiliary layers and methods used in displays; see for example U.S. Pat. Nos. 7,116,318 and 7,535,624;

(g) Color formation and color adjustment; see for example U.S. Pat. Nos. 7,075,502 and 7,839,564;

(h) Methods for driving displays; see for example U.S. Pat. Nos. 7,012,600 and 7,453,445;

(i) Applications of displays; see for example U.S. Pat. Nos. 7,312,784 and 8,009,348;

(j) Non-electrophoretic displays, as described in U.S. Pat. No. 6,241,921 and U.S. Patent Application Publication No. 2015/0277160; and applications of encapsulation and microcell technology other than displays; see for example U.S. Patent Application Publications Nos. 2015/0005720 and 2016/0012710.

Many of the aforementioned patents and applications recognize that the walls surrounding the discrete microcapsules in an encapsulated electrophoretic medium could be replaced by a continuous phase, thus producing a so-called polymer-dispersed electrophoretic display, in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned U.S. Pat. No. 6,866,760. Accordingly, for purposes of the present application, such polymer-dispersed electrophoretic media are regarded as sub-species of encapsulated electrophoretic media.

An encapsulated electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet printing processes; electrophoretic deposition (See U.S. Pat. No. 7,339,715); and other similar techniques.) Thus, the resulting display can be flexible. Further, because the display medium can be printed (using a variety of methods), the display itself can be made inexpensively.

Various types of electro-optic media may be used in the assemblies of the present invention. Referring again to the preferred embodiment of FIG. 1, the electro-optic layer 130 is an encapsulated electrophoretic medium and comprises microcapsules/droplets 140, each of which comprises negatively charged white particles 150 and positively charged black particles 160 in a hydrocarbon-based fluid 165. The microcapsules/droplets 140 are retained within a polymeric binder 170. The electro-optic layer 130 may be deposited on the conductive electrode layer 120, typically by slot coating, the two layers being in electrical contact. In the alternative embodiment of FIG. 2, an electro-optic layer 230 may instead comprise a polymeric sheet 240 comprising a plurality of sealed microcells, and each of the sealed microcells are filled with a dispersion of the white particles 150 and black particles 160.

Upon application of an electrical field across electro-optic layer 130/230, white particles 150 move to the positive electrode and black particles 160 move to the negative electrode, so that electro-optic layer 130 appears, to an observer viewing the display through substrate 110 and/or anisotropically conductive layer 180, white or black depending on whether conductive layer 120 is positive or negative relative to an area of the anisotropically conductive layer 180.

In a first process according to an embodiment of the present invention, the anisotropically conductive layer 180 may be provided over the layer of electro-optic media 130/230 by first coating the top of the layer of electro-optic material 130/230 with a fluid containing a conductive material, one or more moisture-resistive polymers, and a plurality of curable monomers and/or oligomers. After coating the top surface of the layer of electro-optic material 130/230, an electric and/or magnetic field may be applied to the fluid to cause the conductive material to align in a direction that is generally normal to the plane of the layer of electro-optic material. In a final step, the plurality of monomers and/or oligomers are polymerized during application of the electric or magnetic field, so that the conductive material will maintain its aligned position upon ceasing application of the electric or magnetic field.

The one or more monomers may be polymerized using any method known to those of skill in the art, but are preferably UV curable. Examples of monomers that may be used in the various embodiments of the present invention include, but are not limited to, urethanes, acrylates, methacrylates, silicones, epoxies, carbonates, amides, imines, lactones, aliphatic hydrocarbons, olefins, aromatics, and combinations thereof. Oligomers of any of the preceding monomers may be used, for example. The monomers and/or oligomers are preferably well mixed with the conductive material and one or more moisture resistive polymers prior to the coating step, so that the monomers and/or oligomers form a continuous matrix upon polymerization. In some embodiments, the moisture-resistive polymers may be present not more than, with increasing preference in the order given, about 99, 90, 80, 70, 60, and 50 wt. %, and not less than, with increasing preference in the order given, about 45, 35, 25, 20, 15, and 10 wt. % based on the weight of the fluid.

It is preferred that the one or more moisture resistive polymers have a water vapor transmission rate (WVTR) less than or equal to 5 g/(m$^2$*d), more preferably a WVTR less than or equal to 1 g/(m$^2$*d). In some embodiments, the lower limit to the WVTR of the one or more moisture resistive polymers is more than or equal to 0.1 g/(m$^2$*d), and more preferably more than or equal to 0.01 g/(m$^2$*d), more than or equal to 0.001 g/(m$^2$*d). Standardized tests for the determination of WVTRs include those approved by standard-setting bodies such as ASTM International (formerly known as the American Society for Testing Materials), the International Organization for Standardization (ISO), and are quite industry-specific. ASTM has approved two test methods to track water vapor transmission from materials: ASTM E96—Water Vapor Transmission of Materials Using Gravimetric Method, and ASTM F1249—Water Vapor Transmission Rate Through Plastic Film Sheeting Using a Modulated Infrared Sensor. Method F1249 is usually well suited to polymeric layers of sheet materials and can be used to determine whether a polymer sheet is applicable to the assemblies and methods of the present application, although method E96 may be used in instances where F1249 proves inapplicable.

Conductive materials that may be incorporated in the anisotropic conductive layer include, but are not limited to, conductive particles, for example carbon particles, nickel particles, iron particles, silver particles, copper particles, plated polymer spheres, plated glass spheres, indium tin oxide particles, or nano-phase indium tin oxide particles. Alternatively, conductive polymers such as polyacetylene, polyaniline, polypyrrole, poly(3,4-ethylenedioxythiophene) (PEDOT), or polythiophene can be used. It is preferred that amount and materials selected for the anisotropically conductive layer result in a layer having a conductivity that is at least about two orders of magnitude greater in the z-axis direction, i.e. perpendicular to the plane of the anisotropically conductive layer, than the direction parallel to the plane of the layer, i.e. the x-y direction. For example, in one embodiment of the invention, the conductivity of the anisotropically conductive layer in the x-y direction may be less than or equal to about $10^{-10}$ S/cm and greater than or equal to about $10^{-8}$ S/cm in the z-axis direction.

In a second more preferred process according to an embodiment of the present invention, the anisotropically conductive layer 180 may be provided over the layer of electro-optic media 130/230 by coating the top of the layer of electro-optic material 130/230 with a thermoplastic fluid above its melting point containing a conductive material and one or more moisture-resistive polymers. After coating the top surface of the layer of electro-optic material 130/230, an electric and/or magnetic field may be applied to the thermoplastic fluid to cause the conductive material to align in a direction normal to the plane of the layer of electro-optic material 130/230. In a final step, the thermoplastic fluid is cooled during application of the electric or magnetic field, so that the conductive material will maintain its aligned position upon removing the electric or magnetic field.

The second process is more preferred because it does not necessarily require the presence of any potentially hazardous curable monomers, and also the viscosity of the thermoplastic fluid may be more easily controlled with temperature to facilitate coating of the fluid and alignment of the conductive particles.

In yet another embodiment of the present invention, an assembly may be provided in two steps, the first step comprising providing a front plane laminate (FPL) and the second step comprising applying an anisotropic conductive layer to the FPL.

Figure 3:
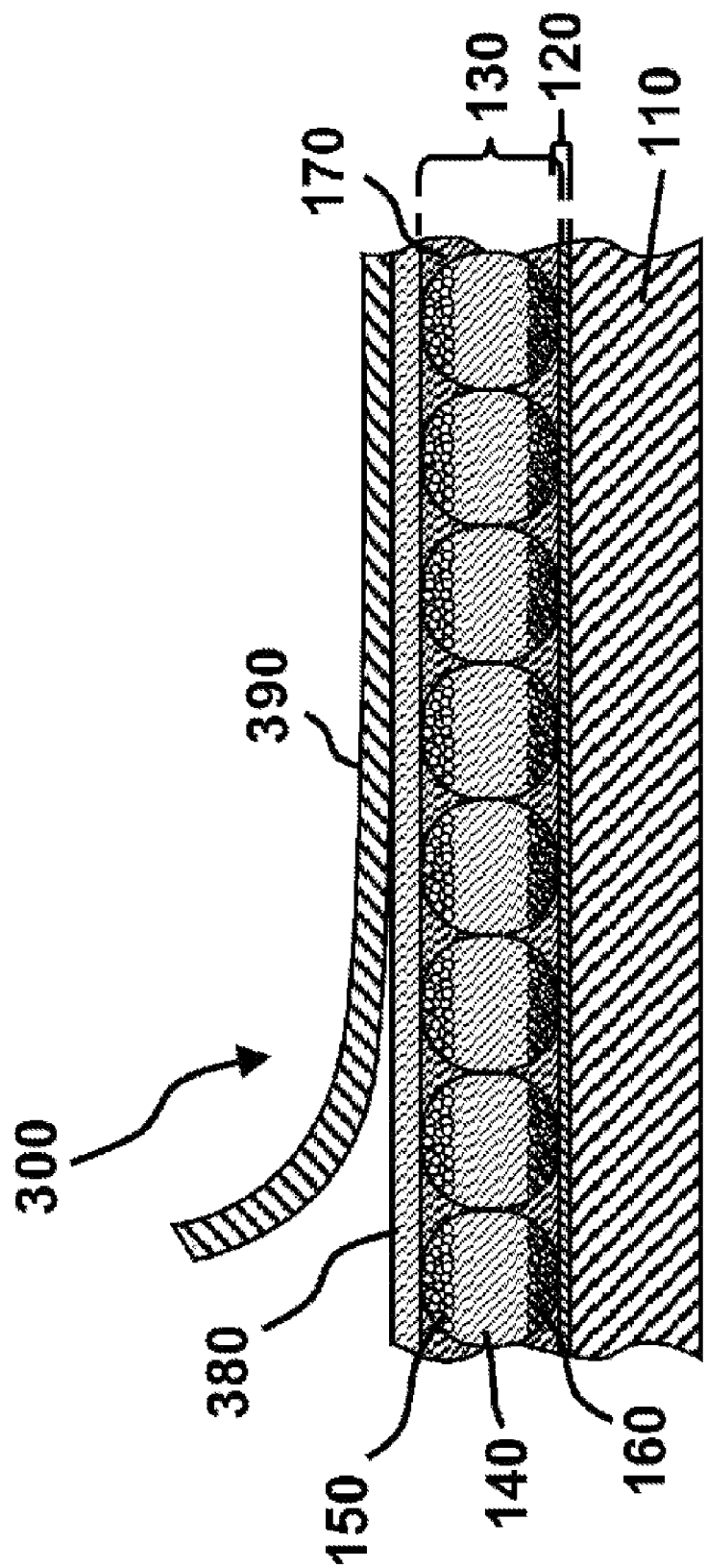
FIG. 3 is a schematic cross-sectional side view of yet another embodiment according to the present invention.

For example, referring to FIG. 3, an FPL 300 may comprise many of the same layers as the assembly illustrated in FIGS. 1 and 2. The FPL 300 may include a substrate 110 having an electrode layer 120 on which a layer of an electro-optic medium 130 is applied. The FPL 300 may differ, however, in that in this first step, the electro-optic medium 130 is preferably coated with a lamination adhesive 380 in liquid form, conveniently by slot coating, on to a release sheet 390, drying (or otherwise curing) the adhesive to form a solid layer and then laminating the adhesive and release sheet to the electro-optic layer 130, which may conveniently be effected using hot roll lamination. Alternatively, but less desirably, the lamination adhesive may be applied over the electro-optic layer 130 and there dried or otherwise cured before being covered with the release sheet 390. In yet another example, a thin layer of adhesive may be incorporated between the electro-optic medium 130 and the electrode layer 120, and the release sheet 390 may be applied directly to the electro-optic medium 130 with no intervening adhesive layer. The lamination adhesive is preferably an anisotropic adhesive and may be prepared, for example, according to the procedures disclosed in U.S. Pat. No. 7,843,626.

The release sheet 390 is conveniently a 7 mil (177 μm) film; depending upon the nature of the electro-optic medium used, it may be desirable to coat this film with a release agent, for example a silicone. In a second step for forming the assembly, the release sheet 390 may be peeled or otherwise removed from the lamination adhesive 380 (as illustrated in FIG. 3) before an anisotropically conductive layer is applied to the FPL 300.

In another embodiment of the invention, the electro-optic medium may be provided with a double release film, such as the "double release sheet" described in U.S. Pat. No. 7,561,324. In one form, a layer of a solid electro-optic medium may be sandwiched between two adhesive layers (preferably anisotropic adhesives), one or both of the adhesive layers being covered by a release sheet. In another form, a layer of a solid electro-optic medium may be sandwiched between two release sheets. Both forms of the double release film may be used in a process generally similar to the process for assembling an electro-optic display from a front plane laminate already described. Typically, in a first lamination step, one release sheet is removed prior laminating the electro-optic medium to a front electrode layer to form a front sub-assembly, and then in a second step, the second release sheet, if present, may be removed prior to application of an anisotropically conductive layer.

As previously noted, the anisotropically conductive layer may serve as a protective layer for a display and may therefore be incorporated into a non-contact display that does not require any driving electrodes in contact with the anisotropically conductive layer to provide improved moisture resistant properties. Alternatively, another optional layer of preferably anisotropic adhesive and an optional release sheet may be applied to the exposed surface of the anisotropically conductive layer, so that, if present, the release sheet may be later removed and the uppermost anisotropic adhesive layer contacted with driving electronics, such as a backplane, under conditions effective to cause the anisotropic adhesive layer to adhere to the driving electronics.

It will be apparent to those skilled in the art that numerous changes and modifications can be made in the specific embodiments of the invention described above without departing from the scope of the invention. Accordingly, the whole of the foregoing description is to be interpreted in an illustrative and not in a limitative sense.

The entire contents of all of the aforementioned U.S. patents and published applications are herein incorporated by reference.

I claim:

1. A method of forming an electro-optic assembly comprising:
   providing a substrate comprising an electrode layer applied to a surface of the substrate;
   applying a layer of electro-optic material to the electrode layer on an opposing side of the electrode layer relative to the substrate, the electro-optic material being configured to switch optical states upon application of an electric field;
   coating the layer of electro-optic material with a fluid, such that the layer of electro-optic material is between the electrode layer and the fluid, the fluid containing a conductive material, a plurality of at least one of monomers and oligomers, and one or more moisture-resistive polymers having a WVTR less than 5 g/(m2*d);
   applying an electric or magnetic field to the fluid to cause the conductive material to align in a direction normal to the layer of electro-optic material; and
   curing the plurality of monomers or oligomers during application of the electric or magnetic field.

2. The method of claim 1, wherein the moisture-resistive polymer has a WVTR less than 1 g/(m$^2$*d).

3. The method of claim 1, wherein the moisture-resistive polymer has a WVTR more than 0.01 g/(m$^2$*d).

4. The method of claim 1, wherein the plurality of monomers are selected from the group consisting of urethanes, acrylates, methacrylates, silicones, epoxies, carbonates, amides, imines, lactones, aliphatic hydrocarbons, olefins, aromatics, and combinations thereof.

5. The method of claim 1, wherein the moisture-resistive polymer is selected from the group consisting of polyisobutylene, styrene-isobutylene-styrene block co-polymers, poly(ethylene-co-norbornene), polyethylene, polypropylene, polyethylene naphthalate, polyvinylidene chloride, polychlorotrifluoroethylene, and combinations thereof.

6. The method of claim 1, wherein the moisture-resistive polymer comprises 10 to 99 wt % of the fluid.

7. The method of claim 1, wherein the electro-optic material comprises an encapsulated electrophoretic material.

8. The method of claim 1, wherein the cured plurality of monomers or oligomers form a planar film and the planar film has a conductivity of at least $10^{-8}$ S/cm in a direction perpendicular to a plane of the film and less than or equal to about $10^{-10}$ S/cm in a direction parallel to the plane of the film.

9. A method of forming an electro-optic assembly comprising:
   providing a substrate comprising an electrode layer applied to a surface of the substrate;
   applying a layer of electro-optic material to the electrode layer on an opposing side of the electrode layer relative to the substrate, the electro-optic material being configured to switch optical states upon application of an electric field;
   coating the layer of electro-optic material with a thermoplastic fluid, such that the layer of electro-optic material is between the electrode layer and the thermoplastic fluid, the thermoplastic fluid containing a conductive material and one or more moisture-resistive polymers having a WVTR less than 5 g/(m2*d);
   applying an electric or magnetic field to the thermoplastic fluid to cause the conductive material to align in a direction normal to the layer of electro-optic material; and
   cooling the thermoplastic fluid to form a solid thermoplastic during application of the electric or magnetic field.

10. The method of claim 9, wherein the moisture-resistive polymer has a WVTR less than 1 g/(m$^2$*d).

11. The method of claim 9, wherein the moisture-resistive polymer has a WVTR more than 0.01 g/(m$^2$*d).

12. The method of claim 9, wherein the moisture-resistive polymer is selected from the group consisting of polyisobutylene, styrene-isobutylene-styrene block co-polymers, poly(ethylene-co-norbornene), polyethylene, polypropylene, polyethylene naphthalate, polyvinylidene chloride, polychlorotrifluoroethylene, and combinations thereof.

13. The method of claim 9, wherein electro-optic material comprises a layer of encapsulated electrophoretic material.

14. The method of claim 9, wherein the solid thermoplastic forms a planar film and the planar film has a conductivity of at least $10^{-8}$ S/cm in a direction perpendicular to a plane of the film and less than or equal to about $10^{-10}$ S/cm in a direction parallel to the plane of the film.

* * * * *